(12) United States Patent
Yim et al.

(10) Patent No.: US 12,708,001 B2
(45) Date of Patent: Aug. 11, 2026

(54) SEMICONDUCTOR PACKAGE AND METHOD OF MANUFACTURING THE SEMICONDUCTOR PACKAGE

(71) Applicant: SAMSUNG ELECTRONICS CO., LTD, Suwon-si (KR)

(72) Inventors: Choongbin Yim, Suwon-si (KR); Gitae Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 626 days.

(21) Appl. No.: 18/297,249

(22) Filed: Apr. 7, 2023

(65) Prior Publication Data

US 2024/0088005 A1 Mar. 14, 2024

(30) Foreign Application Priority Data

Sep. 8, 2022 (KR) ........................ 10-2022-0113927

(51) Int. Cl.
*H10W 70/60* (2026.01)
*H10B 80/00* (2023.01)
(Continued)

(52) U.S. Cl.
CPC .......... *H10W 70/635* (2026.01); *H10B 80/00* (2023.02); *H10W 70/05* (2026.01); (Continued)

(58) Field of Classification Search
CPC ........... H01L 23/49827; H01L 21/4857; H01L 21/56; H01L 23/3128; H01L 23/49816; (Continued)

(56) References Cited

U.S. PATENT DOCUMENTS 8,263,434 B2 9/2012 Pagaila et al.
8,994,134 B2 3/2015 Izuka
(Continued)

FOREIGN PATENT DOCUMENTS

KR 10-2022-0117032 A 8/2022

OTHER PUBLICATIONS

1 Office Action dated May 18, 2026 issued in corresponding to Korean Patent Application No. 10-2022-0113927.

*Primary Examiner* — Elias Ullah
(74) *Attorney, Agent, or Firm* — Morgan, Lewis & Bockius LLP

(57) ABSTRACT

A semiconductor package includes a first redistribution wiring layer including a first redistribution wiring, a semiconductor chip disposed on the first redistribution wiring layer, a plurality of interposer connectors disposed on the first redistribution wiring layer, each of the plurality of interposer connectors including a first surface facing the first redistribution wiring layer and a second surface opposite the first surface, a plurality of through electrodes and a plurality of core balls formed on the first surface and including a core and a solder layer, the through electrodes being electrically connected to the first redistribution wiring by the core balls, a molding member on the first redistribution wiring layer that covers the semiconductor chip, and a second redistribution wiring layer disposed on the molding member including a second redistribution wiring electrically connected to the through electrodes.

20 Claims, 14 Drawing Sheets

(51) Int. Cl.

| | |
|---|---|
| ***H10W 70/05*** | (2026.01) |
| ***H10W 70/63*** | (2026.01) |
| ***H10W 70/685*** | (2026.01) |
| ***H10W 74/01*** | (2026.01) |
| ***H10W 74/10*** | (2026.01) |
| ***H10W 90/00*** | (2026.01) |
| *H10W 72/00* | (2026.01) |
| *H10W 72/30* | (2026.01) |
| *H10W 74/15* | (2026.01) |

(52) U.S. Cl.

CPC ........ *H10W 70/611* (2026.01); *H10W 70/685* (2026.01); *H10W 74/01* (2026.01); *H10W 74/117* (2026.01); *H10W 90/401* (2026.01); *H10W 90/701* (2026.01); *H10W 72/072* (2026.01); *H10W 72/07354* (2026.01); *H10W 72/347* (2026.01); *H10W 72/865* (2026.01); *H10W 72/884* (2026.01); *H10W 74/15* (2026.01); *H10W 90/724* (2026.01); *H10W 90/732* (2026.01); *H10W 90/734* (2026.01); *H10W 90/752* (2026.01); *H10W 90/754* (2026.01)

(58) Field of Classification Search

CPC ........... H01L 23/49822; H01L 23/5383; H01L 23/5385; H01L 24/16; H01L 24/81; H01L 24/32; H01L 24/33; H01L 24/48; H01L 24/73; H01L 2224/16227; H01L 2224/32145; H01L 2224/32225; H01L 2224/33181; H01L 2224/48145; H01L 2224/48227; H01L 2224/73204; H01L 2224/73215; H01L 2224/73265; H01L 2224/81; H01L 23/36; H01L 23/5389; H01L 25/50; H01L 2221/68345; H01L 2225/1023; H01L 2225/1035; H01L 2225/1058; H01L 21/568; H01L 21/6835; H01L 23/562; H01L 2225/1041; H01L 25/105; H01L 23/3107; H01L 24/07; H01L 24/15; H01L 2224/02331; H01L 2224/02333; H01L 2224/02371; H01L 2224/02379; H01L 2224/02381; H01L 2225/107; H10B 80/00

See application file for complete search history.

(56) References Cited

U.S. PATENT DOCUMENTS

| | | | |
|---|---|---|---|
| 9,362,161 | B2 | 6/2016 | Chi et al. |
| 10,186,480 | B2 | 1/2019 | Muthukumar et al. |
| 10,388,637 | B2 | 8/2019 | Kim et al. |
| 10,535,632 | B2 | 1/2020 | Jeng et al. |
| 10,679,919 | B2 | 6/2020 | Kang et al. |
| 11,942,458 | B2 | 3/2024 | Lee et al. |
| 2020/0273799 | A1 | 8/2020 | Sung et al. |
| 2021/0082798 | A1 | 3/2021 | Lu et al. |
| 2021/0320067 | A1 | 10/2021 | Kim et al. |

10
600
600a
600b
600c
601b
601a
602
602a
602b
602c
502
A
500
504
102
102a
102b
102c
103a
103b
200
202
204
210
230
300
400
100
100a
100b
100c
101a
101b
130
H1
H2
R1
R2

11
900
850
814
810
812
602c
602b
602a
602
502
500
504
102c
102b
102a
102
840
824
834
830
820
832
822
200
230
210
204
202
103b
102c
103a
R2
R1
H1
H2
130
800
700
601b
600c
600b
600a
600
601a
300
400
101b
100c
100b
100a
100
101a

SEMICONDUCTOR PACKAGE AND METHOD OF MANUFACTURING THE SEMICONDUCTOR PACKAGE

CROSS-REFERENCE TO RELATED APPLICATION(S)

This application claims priority under 35 USC § 119 to Korean Patent Application No. 10-2022-0113927, filed on Sep. 8, 2022, in the Korean Intellectual Property Office (KIPO), the contents of which are herein incorporated by reference in their entirety.

TECHNICAL FIELD

Example embodiments relate to a semiconductor package and a method of manufacturing the semiconductor package. More particularly, example embodiments relate to a multi-chip package including a plurality of chips stacked on one another and a method of manufacturing the same.

DISCUSSION OF RELATED ART

In manufacturing a package-on-package (POP) device, an interposer may be used as an electrical interface of a package. Different methods of electrically connecting to packages using an interposer may be used. These methods typically use solder bumps to electrically connect to the interposer. The interposers may have poor height uniformity due to the use of the solder bumps. The poor height uniformity may result in warpage of the interposer and a non-wetting defect may occur. The non-wetting defect may be a soldering defect that occurs when a solder bump fails to bond.

SUMMARY

Example embodiments provide a semiconductor package that may be free of non-wetting defects that may be due to warpage and may have improved electrical reliability.

Example embodiments provide a method of manufacturing the semiconductor package.

According to example embodiments, a semiconductor package includes a first redistribution wiring layer including a first redistribution wiring, a semiconductor chip disposed on the first redistribution wiring layer, a plurality of interposer connectors on the first redistribution wiring layer, each of the plurality of interposer connectors including a first surface facing the first redistribution wiring layer and a second surface opposite the first surface, a plurality of through electrodes and a plurality of core balls formed on the first surface, each of the core balls including a core and a solder layer covering the core, the through electrodes being electrically connected to the first redistribution wiring by the core balls, a molding member disposed on the first redistribution wiring layer that covers the semiconductor chip, and a second redistribution wiring layer disposed on the molding member and including a second redistribution wiring electrically connected to the through electrodes.

According to example embodiments, a semiconductor package includes a first redistribution wiring layer including a chip mounting region and a peripheral region surrounding the chip mounting region, the first redistribution wiring layer having a first redistribution wiring, a semiconductor chip mounted on the chip mounting region on the first redistribution wiring layer, a plurality of interposer connectors disposed on the peripheral region of the first redistribution wiring layers, each of the plurality of interposer connectors including a connector substrate in which a plurality of through electrodes are formed, first connector pads at first end portions of the plurality of through electrodes, second connector pads at second end portions of the plurality of through electrodes and a plurality of core balls on the first connector pads, each of the core balls having a core and a solder layer surrounding the core, the plurality of interposer connectors electrically connected to the first redistribution wiring layer via the core balls, a molding member on the first redistribution wiring layer that covers the semiconductor chip and a second redistribution wiring layer disposed on the molding member and having a second redistribution wiring electrically connected to the second connector pads.

According to example embodiments, in a method of manufacturing a semiconductor package, a redistribution wiring layer including a chip mounting region and a peripheral region surrounding the chip mounting region and having a first redistribution wiring is formed. A semiconductor chip is mounted on the chip mounting region on the first redistribution wiring layer. A plurality of interposer connectors is formed, each of the plurality of interposer connectors including a connector substrate in which a plurality of through electrodes are formed, first connector pads at first end portions of the plurality of through electrodes and second connector pads at second end portions of the plurality of through electrodes opposite the first end portions and a plurality of core balls on the first connector pads, each of the core balls having a core and a solder layer surrounding the core. The plurality of interposer connectors is mounted on the peripheral region on the first redistribution wiring layer via the core balls. A molding member is formed on the first redistribution wiring layer covering the semiconductor chip. A second redistribution wiring layer is formed on the molding member, the second redistribution wiring layer having a second redistribution wiring electrically connected to the second connector pads.

According to example embodiments, a semiconductor package may include a first redistribution wiring layer, a semiconductor chip disposed on a chip mounting region of the first redistribution wiring layer, a plurality of interposer connectors disposed on a peripheral region on the first redistribution wiring layer and including a connector substrate in which a plurality of through electrodes are formed, a molding member on the first redistribution wiring layer that covers the semiconductor chip and a second redistribution wiring layer having a second redistribution wiring disposed on the molding member.

The interposer connectors may be mounted on the first redistribution layer via core balls having a core and a solder layer. The first redistribution wiring of the first redistribution wiring layer and the second redistribution wiring of the second redistribution wiring layer may be electrically connected to each other by the core balls and the through electrodes of the interposer connectors.

The core balls may support the interposer connector to have a predetermined height on the first redistribution wiring layer. Thus, a non-wetting defect of the interposer connector in the first redistribution wiring layer due to warpage may be prevented, which may improve an electrical reliability of Fan-Out (FO) Packages.

DETAILED DESCRIPTION OF EXAMPLE EMBODIMENTS

Hereinafter, example embodiments will be explained in detail with reference to the accompanying drawings.

Figure 1:
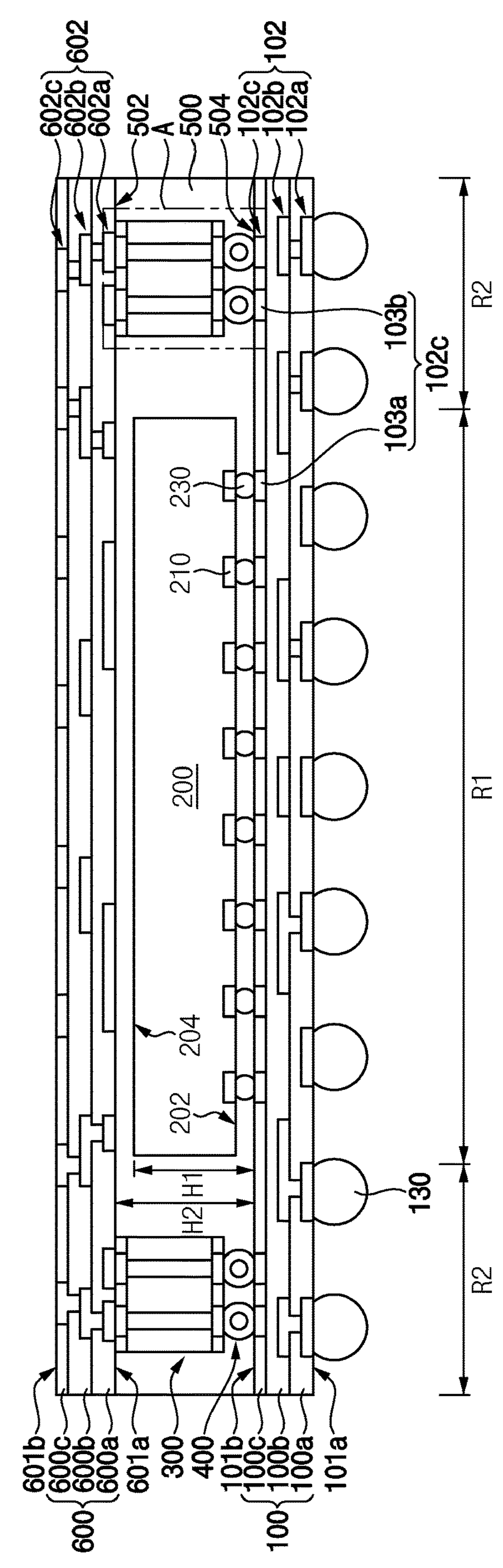
FIG. 1 is a cross-sectional view illustrating a semiconductor package in accordance with example embodiments.
Figure 2:
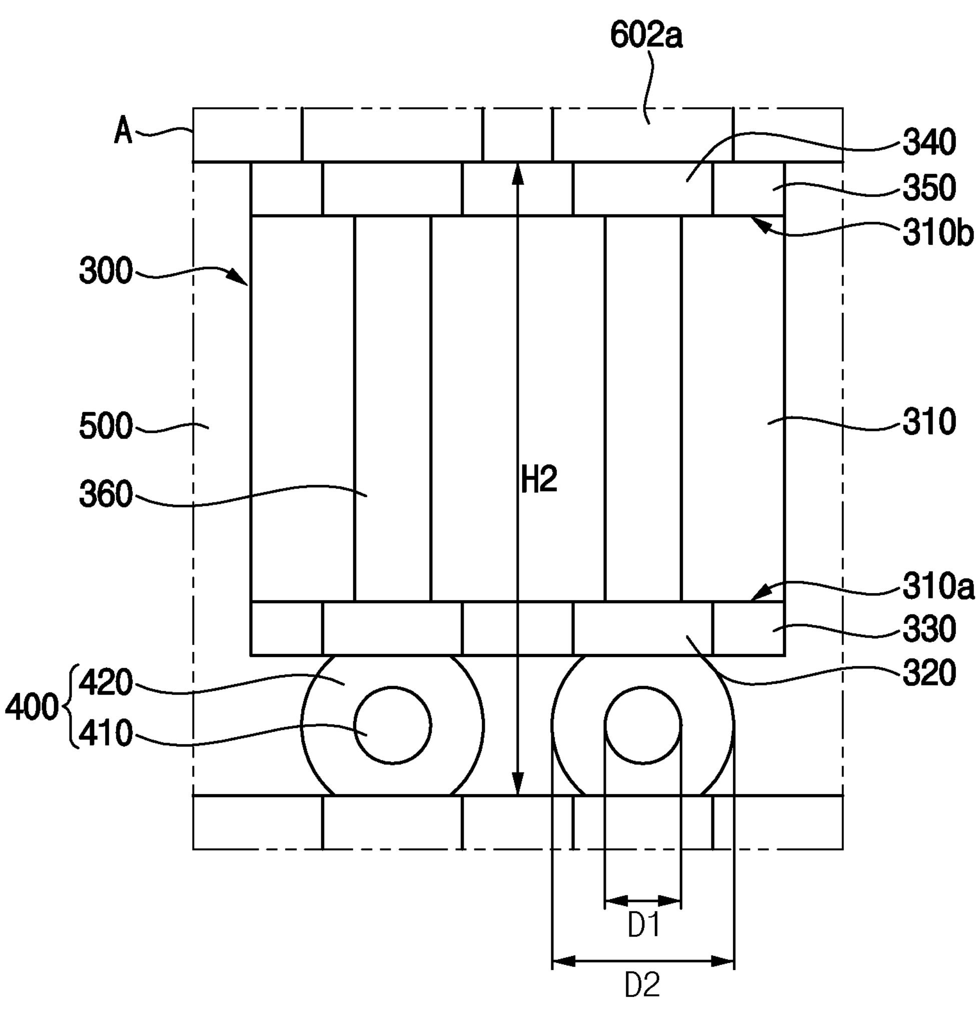
FIG. 2 is an enlarged cross-sectional view illustrating portion 'A' in FIG. 1.
Figure 3:
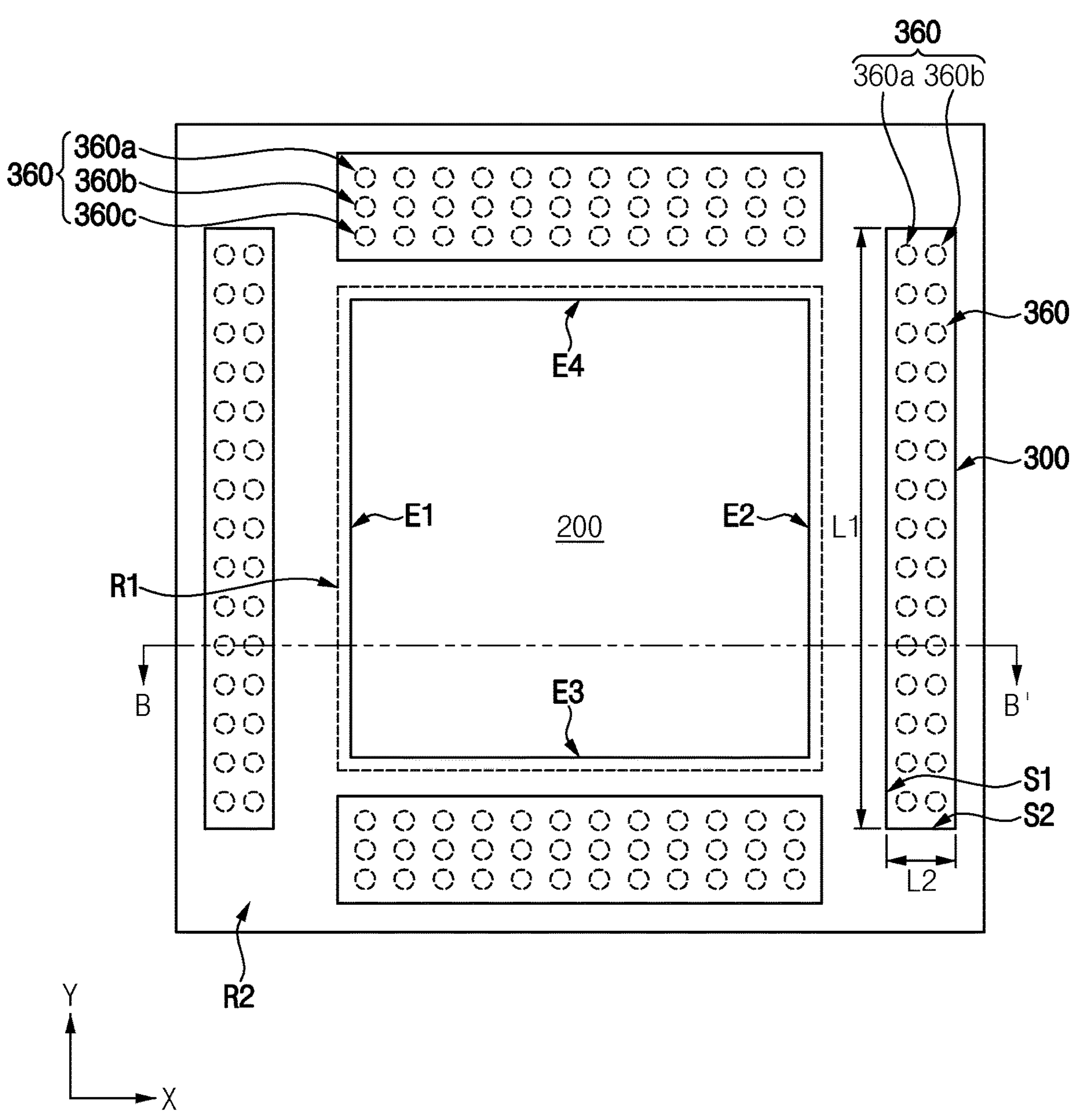
FIG. 3 is a plan view illustrating a first semiconductor chip and a plurality of interposer connectors mounted on a first redistribution wiring layer in FIG. 1.

FIG. 1 is a cross-sectional view illustrating a semiconductor package in accordance with example embodiments. FIG. 2 is an enlarged cross-sectional view illustrating portion A of FIG. 1. FIG. 3 is a plan view illustrating a first semiconductor chip and a plurality of interposer connectors mounted on a first redistribution wiring layer in FIG. 1. FIG. 1 is a cross-sectional view taken along the line BB' in FIG. 3.

Referring to FIGS. 1 to 3, a semiconductor package 10 may include a first redistribution wiring layer 100, a first semiconductor chip 200, a plurality of interposer connectors 300, a molding member 500 and a second redistribution wiring layer 600. In addition, the semiconductor package 10 may further include external connection members 130 on an outer surface of the first redistribution wiring layer 100.

The semiconductor package 10 may be used in different packaging technologies. For example, the semiconductor package 10 may be used as a fan-out package-on-package (FO Package On Package). The semiconductor package 10 may be a multi-chip package (MCP) including different types of semiconductor chips. The semiconductor package 10 may be a system-in-package (SIP) including a plurality of semiconductor chips stacked or disposed in one package, which may have functionality independent of other devices.

In example embodiments, the first redistribution wiring layer 100 as a front redistribution wiring layer may include a first redistribution wiring 102. The first redistribution wiring layer 100 may include a first lower insulation layer 100*a*, a second lower insulation layer 100*b*, a third lower insulation layer 100*c*. The first to third lower insulation layers 100*a*, 100*b* and 100*c* may be stacked. The first redistribution wiring 102 may be formed in the first to third lower insulation layers 100*a*, 100*b* and 100*c*. The first redistribution wiring 102 may include a first lower redistribution wiring 102*a*, a second lower redistribution wiring 102*b* and a third lower redistribution wiring 102*c*. The first lower redistribution wiring 102*a* may be formed in the first lower insulation layer 100*a*, the second lower redistribution wiring 102*b* may be formed in the second lower insulation layer 100*b* and the third lower redistribution wiring 102*c* may be formed in the third lower insulation layer 100*c*. For example, a thickness of the first redistribution wiring layer 100 may be within a range of about 5 μm to about 50 μm, and more particularly within a range of 5 μm to 50 μm.

The first redistribution wiring layer 100 may have a first surface 101*a* and a second surface 101*b* opposite the first surface 101*a*. When viewed from a plan view, the first redistribution wiring layer 100 may include a first region R1 positioned in a central region and a second region R2 surrounding the first region R1. The first region R1 may be a chip mounting region overlapping the first semiconductor chip 200 mounted on the second surface 101*b* of the first redistribution wiring layer 100 and the second region R2 may be a peripheral region in which a plurality of interposer connectors 300 are arranged. The interposer connectors 300 may be disposed outside of the first region R1 including the first semiconductor chip 200.

An uppermost redistribution wiring (e.g., third lower redistribution wiring 102*c*) of the first redistribution wiring layer 100 may include a first uppermost redistributions wiring 103*a* disposed in the first region R1 and electrically connected to first chip pads 210 of the first semiconductor chip 200 and a second uppermost redistribution wiring 103*b* disposed in the second region R2 and electrically connected to first connector pads 320 of the interposer connector 300. Bump pads such as under bump metallurgy (UBM) may be formed on redistribution pad portions of the first uppermost redistribution wiring 103*a* and the second uppermost redistribution wiring 103*b*.

The first lower insulation layer 100*a* may expose at least portions of the first lower redistribution wiring 102*a*. The first lower insulation layer 100*a* may serve as a passivation layer. A bump pad (not illustrated in the figures) such as UBM may be arranged on the first lower redistribution wiring 102*a* exposed by the first lower insulation layer 100*a*. In this case, the exposed portion of the first lower redistribution wiring 102*a* may serve as a landing pad, that is, a package pad.

The number, size, arrangement, etc. of the lower insulation layers and the lower redistribution wiring of the first redistribution wiring layer 100 are provided as examples, but the present disclosure may not be limited thereto.

In example embodiments, the first semiconductor chip 200 may be disposed in the first region R1 of the first redistribution wiring layer 100. The first semiconductor chip 200 may be mounted on the second surface 101*b* of the first redistribution wiring layer 100 by a flip chip bonding method. The first semiconductor chip 200 may be disposed such that the first chip pads 210 are formed on a front surface 202 of the first semiconductor chip 200. That is, an active surface of the first semiconductor chip 200 may face the first redistribution wiring layer 100. The first chip pads 210 of the first semiconductor chip 200 may be electrically connected to the first redistribution wiring 102 of the redistribution wiring layer 100. For example, the first chip pads 210 of the first semiconductor chip 200 may be electrically connected to the first uppermost redistribution wiring 103*a* by first conductive bumps 230.

The first conductive bumps 230 may include micro-bumps. The first conductive bumps 230 may include pillar portions formed on the first chip pads and solder portions formed on the pillar portions. The pillar portion may include, for example, copper (Cu), nickel (Ni), palladium (Pd), platinum (Pt), gold (Au), cobalt (Co), or an alloy thereof. The solder portion may include, for example, tin (Sn), indium (In), antimony (Sb), copper (Cu), silver (Ag), zinc (Zn), lead (Pb), or an alloy thereof.

Although not illustrated in the figures, a first underfill member may be underfilled between the first semiconductor chip 200 and the first redistribution wiring layer 100. The first underfill member may include a material having relatively high fluidity to effectively fill a space between the first semiconductor chip and the first redistribution wiring layer. For example, the first underfill member may include an adhesive containing an epoxy material.

The first semiconductor chip 200 may have a first height H1 from the second surface 101*b* of the first redistribution wiring layer 100. For example, a thickness of the first semiconductor chip 200 may be within a range of about 100 μm to about 500 μm, and more particularly within a range of 100 μm to 500.

The first semiconductor chip 200 may be a logic chip including a logic circuit. The logic chip may be a controller that controls memory chips. The first semiconductor chip 200 may be a processor chip such as an ASIC or an application processor (AP) serving as a host such as a central processing unit (CPU), graphic processing unit (GPU), or a system-on-chip (SOC). Various examples of the first semiconductor chip 200 are described herein, but the present disclosure may not be limited thereto.

In example embodiments, the plurality of interposer connectors 300 may be disposed in the second region R2 of the first redistribution wiring layer 100. The interposer connectors 300 may be mounted on the second surface 101*b* of the first redistribution wiring layer 100 by a flip chip bonding method. The interposer connector 300 may be disposed such that a first surface 310*a* of a connector substrate 310, on which the first connector pads 320 are formed, faces the first redistribution wiring layer 100. The first connector pads 320 of the interposer connector 300 may be electrically connected to the first redistribution wiring 102 of the first redistribution wiring layer 100, that is, the second uppermost redistribution wiring 103*b* by core balls 400.

As illustrated in FIG. 2, each of the interposer connectors may include the connector substrate 310 in which a plurality of through electrodes 360 are formed, first connector pads 320 and second connector pads 340 respectively disposed at both end portions of the plurality of through electrodes 360 and core balls 400 respectively formed on the first connector pads 320 and having a core 410 and a solder layer 420 surrounding the core 410. The first connector pads 320 may be formed in a lower layer 330 of the interposer connector 300, and the second connector pads 340 may be formed in an upper layer 350 of the interposer connector 300. That is, the through electrodes 360 may penetrate the connector substrate 310.

The core ball 400 may include the core 410 and the solder layer 420 covering the core 410. For example, the core 410 may have a spherical or ellipsoidal shape. The core 410 may include a material different from the solder layer 420. The core 410 may include, for example, a metal such as copper (Cu) or polymer material. The solder layer 420 may include, for example, tin (Sn), indium (In), bismuth (Bi), antimony (Sb), copper (Cu), silver (Ag), zinc (Zn), lead (Pb), or an alloy thereof.

A diameter D2 of the core ball 400, including the core 410 and the solder layer 420, may be within a range of about 30 μm to about 300 μm, and more particularly within a range of 30 μm to 300 μm. A diameter D1 of the core 410 may be within a range of about 25 μm to about 250 μm, and more particularly, within a range of 25 μm to 250 μm. Additionally, the core 410 may have a first melting point, and the solder layer 420 may have a second melting point lower than the first melting point.

The first semiconductor chip 200 may have the first height H1 from the second surface 101*b* of the first redistribution wiring layer 100, and the interposer connector 300 may have a second height H2 from the second surface 101*b* of the first redistribution wiring layer 100. The second height H2 may be greater than or equal to the first height H1.

As illustrated in FIG. 3, four interposer connectors 300 may be disposed around the first semiconductor chip 200 on the first redistribution wiring layer 100. When viewed from a plan view, the first semiconductor chip 200 may have a rectangular shape having four side portions E1, E2, E3, and E4. In some examples, the first semiconductor chip 200 may have a square shape. The four interposer connectors 300 may be disposed respectively adjacent to the four side portions E1, E2, E3, and E4 of the first semiconductor chip 200.

The interposer connector 300 may have a rectangular shape extending in one direction. The interposer connector 300 extending along the second side portion E2 of the first semiconductor chip 200 may have a short side L2 in a first direction (X direction) and a long side L1 in a second direction (Y direction). The long side L1 of the interposer connector 300 may be greater than a length of the side portion E2 of the first semiconductor chip 200. Alternatively, a length of the long side L1 of the interposer connector 300 may be less than the length of the side portion E2 of the first semiconductor chip 200.

The through electrodes 360 may be disposed within the connector substrate 310 to be to be spaced apart from each other. The interposer connector 300 may include an array of through electrodes 360 arranged in a plurality of rows and columns. For example, the interposer connector 300 extending along the second side portion E2 of the first semiconductor chip 200 may include a first column of through electrodes 360*a* and a second column of through electrodes 360*b*. In another example, the interposer connector extending along the fourth side portion E4 of the first semiconductor chip 200 may include a first row of through electrodes 360*a*, a second row of through electrodes 360*b* and a third row of through electrodes 360*c*.

The lengths of the short and long sides of the interposer connector, the height of the interposer connector, the arrangement of the through electrodes, etc. are provided as examples, but the present disclosure may not be limited thereto. For example, the lengths of the short and long sides of the interposer connector, the height of the interposer connector, and the arrangement of the through electrodes, etc. may be determined in consideration of the thickness and warpage of the entire package.

In example embodiments, the molding member 500 may cover the first semiconductor chip 200 and the plurality of interposer connectors 300 on the second surface 101*b* of the first redistribution wiring layer 100. For example, the molding member 500 may cover an upper chip surface 204 The molding member 500 may expose the second connector pads 340 of the plurality of interposer connectors 300. For example, the molding member 500 may expose the upper layer 350 of the plurality of interposer connectors 300, including the second connector pads 340 formed therein.

For example, the molding member 500 may include epoxy mold compound (EMC). The molding member 500 may include an ultraviolet (UV) resin, a polyurethane resin, a silicon resin, a silica filler, etc.

In example embodiments, the second redistribution wiring layer 600 may be disposed on the molding member 500 as a backside redistribution wiring layer. The second redistribution wiring layer 600 may include the second redistribution wiring 602. The second redistribution wiring may be electrically connected to the second connector pads 340. The second redistribution wiring layer 600 may include a first upper insulation layer 600*a*, a second upper insulation layer 600*b* and a third upper insulation layer 600*c*. The first upper insulation layer 600*a*, the second upper insulation layer 600*b* and the third upper insulation layer 600*c* may be stacked. The second redistribution wiring 602 may be formed in the first to third upper insulation layers 600*a*, 600*b* and 600*c*. The second redistribution wiring 602 may include a first upper redistribution wiring 602*a*, a second upper redistribution wiring 602*b* and a third upper redistribution wiring 602*c*. The first upper redistribution wiring 602*a* may be formed in the first upper insulation layer 600*a*, the second upper redistribution wiring 602*b* may be formed in the second upper insulation layer 600*b* and the third upper redistribution wiring 602*c* may be formed in the third upper insulation layer 600*c*. The second redistribution wiring layer 600 may have a first surface 601*a* and a second surface 601*b* opposite each other.

The third upper insulation layer 600*c* may have openings that expose the third upper redistribution wiring 602*c* respectively. The third upper redistribution wiring 602*c* exposed by the openings may be an outermost redistribution wiring. A portion of the outermost redistribution wiring may include a redistribution pad portion. Although not illustrated in the figures, a bump pad such as UBM may be formed on the redistribution pad portion.

The number, size, arrangement, etc. of the upper insulation layers and the upper redistribution wiring of the second redistribution wiring layer are provided as examples, but the present disclosure may not be limited thereto.

In example embodiments, the external connection members 130 may be disposed on the package pads on the first surface 101*a* of the first redistribution wiring layer 100 for electrical connection with an external device. For example, the external connection member 130 may be a solder ball. The semiconductor package 10 may be mounted on a module board (not illustrated in the figures) via the external connection members 130.

Some of the external connection members 130 may be disposed in the second region R2 outside the first region R1 where the first semiconductor chip 200 is disposed. Accordingly, the semiconductor package 10 may be provided as a fan-out package.

As mentioned above, the semiconductor package 10 may include the first redistribution wiring layer 100 including the first region R1, which may be a chip mounting region, and the second region R2, which may be a peripheral region R2, surrounding the first region R1, and the first redistribution wiring layer 100 further having the first redistribution wiring 102. The semiconductor package 10 may include the first semiconductor chip 200 may be mounted in the first region R1 of the first redistribution wiring layer 100. The semiconductor package 10 may include the plurality of interposer connectors 300, which may be disposed in the second region R2 and on the first redistribution wiring layer 100, and which may include the plurality of through electrodes 360 that may be formed in the connector substrate 310. The semiconductor package 10 may include the molding member 500 on the first redistribution wiring layer 100, which may cover the first semiconductor chip 200 and the plurality of interposer connectors 300. The semiconductor package 10 may include the second redistribution wiring layer 600, which may be disposed on the molding member 500 and may include the second redistribution wiring 602.

The interposer connectors 300 may be mounted on the first redistribution wiring layer 100 via the core balls 400 that have the core 410 and the solder layer 420. The first redistribution wiring 102 of the first redistribution wiring layer 100 and the second redistribution wiring 602 of the second redistribution wiring layer 600 may be electrically connected to each other by the core balls 400 and the through electrodes 360 of the interposer connectors 300.

The core balls 400 may support the interposer connector 300 to have a predetermined height on the first redistribution wiring layer 100. Accordingly, a non-wetting defect of the interposer connector 300 in the first redistribution wiring layer 100 due to warpage may be prevented.

Hereinafter, a method of manufacturing a semiconductor package of FIG. 1 will be explained.

Figure 10:
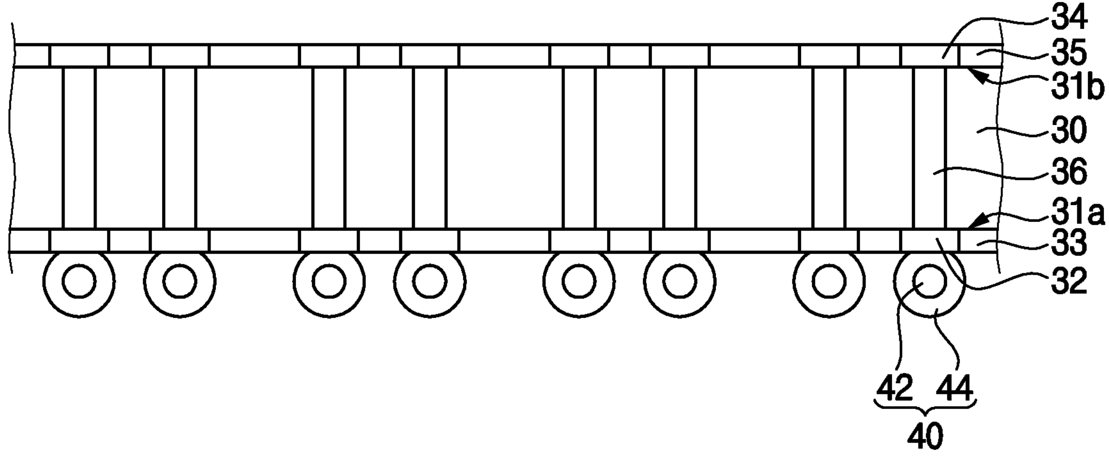
Figure 11:
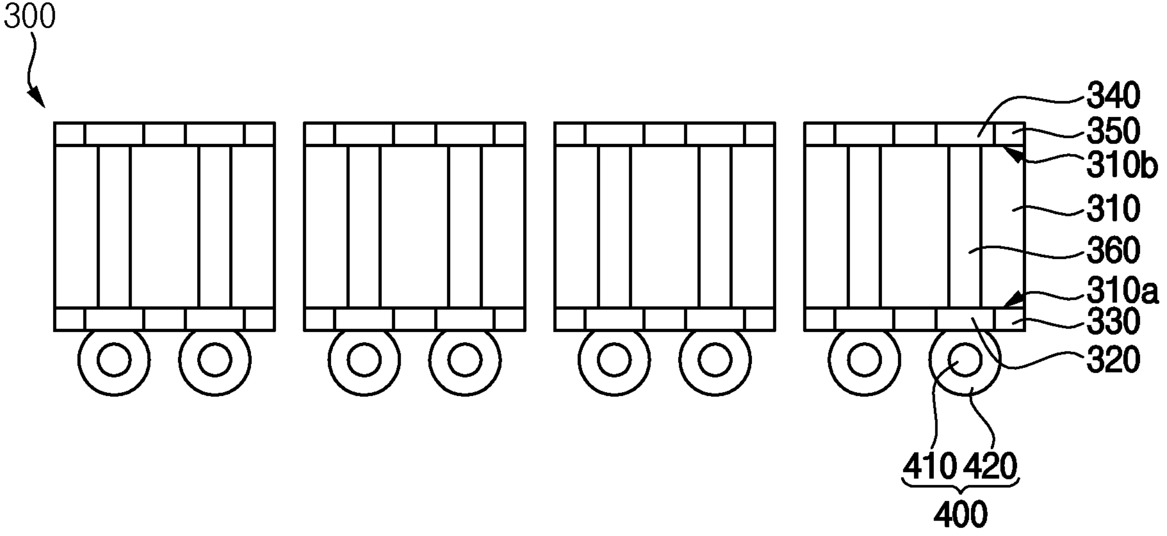
Figure 12:
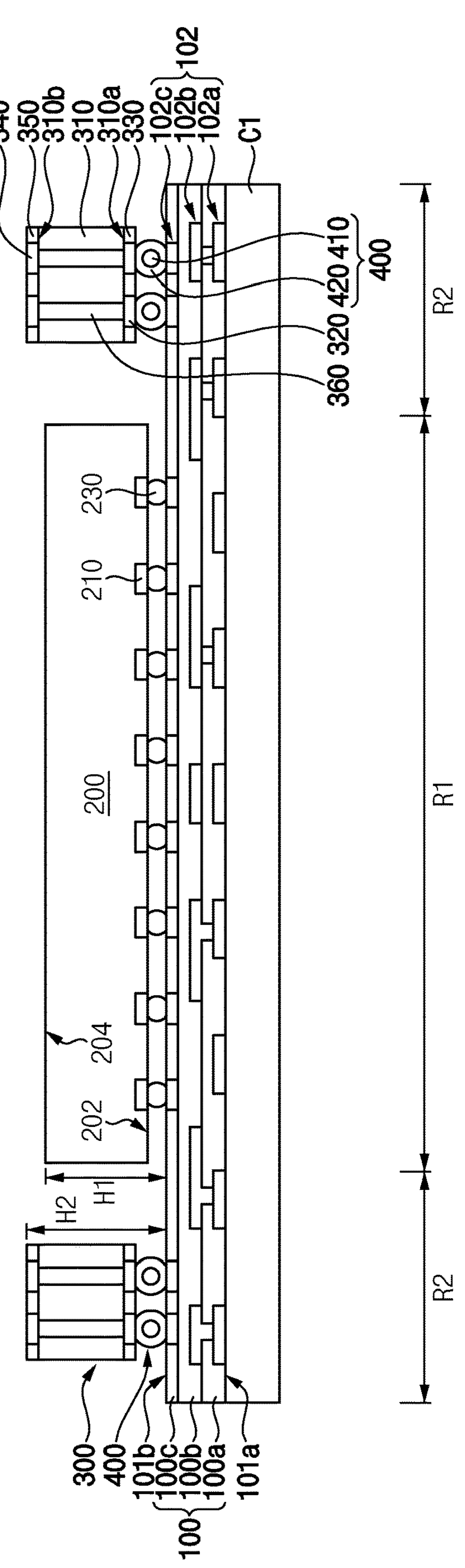
Figure 13:
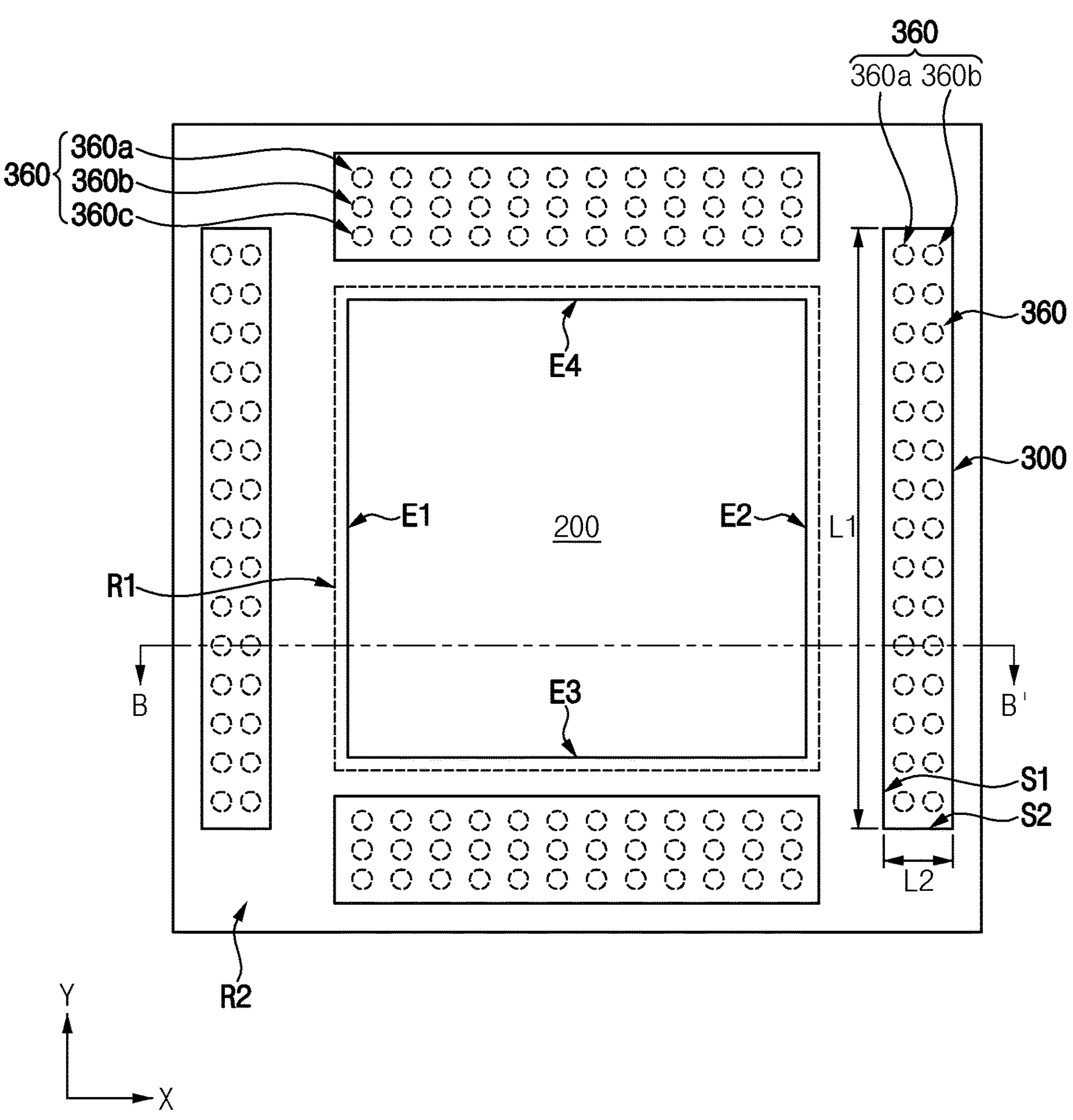

FIGS. 4 to 15 are views illustrating a method of manufacturing a semiconductor package in accordance with example embodiments. FIGS. 4 to 12, 14 and 15 are cross-sectional views illustrating a method of manufacturing a semiconductor package in accordance with example embodiments. FIG. 13 is a plan view of FIG. 12. FIGS. 6 to 11 are cross-sectional views illustrating a process of forming interposer connectors illustrated in FIG. 12. FIG. 12 is a cross-sectional view taken along the line C-C' in FIG. 13.

Figure 4:
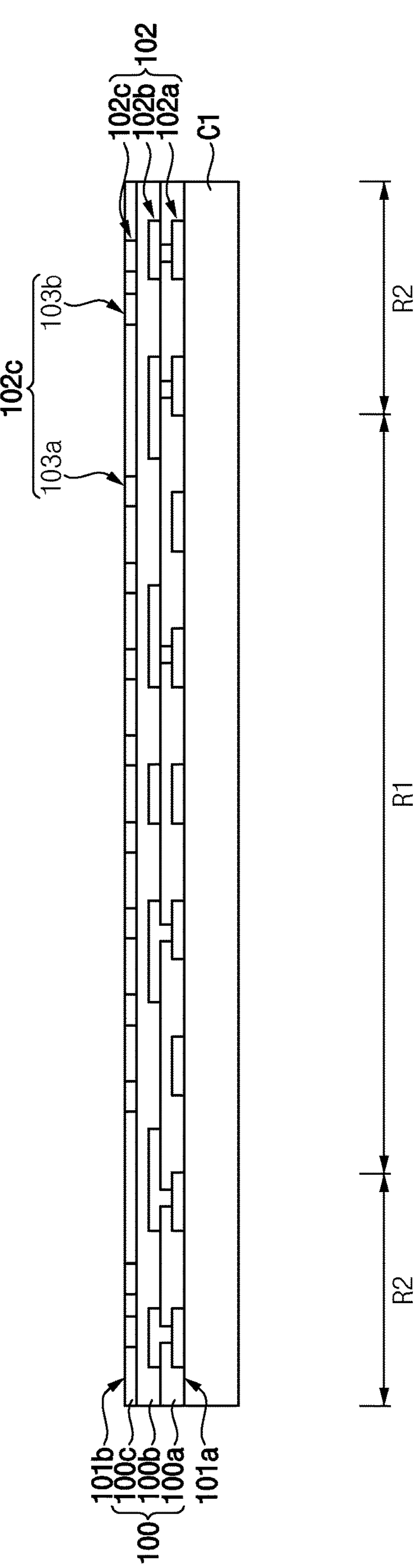
FIGS. 4 to 15 are views illustrating a method of manufacturing a semiconductor package in accordance with example embodiments.

Referring to FIG. 4, a first redistribution wiring layer 100 having a first redistribution wiring 102 may be formed on a first carrier substrate C1.

In example embodiments, a first lower redistribution wiring 102*a* may be formed on the first carrier substrate C1, and a first lower insulation layer 100*a* covering the first lower redistribution wiring 102*a* may be formed on the first carrier substrate C1.

For example, the first lower redistribution wiring 102*a* may be formed by an electroplating process. For example, after a seed layer is formed on the first carrier substrate C1, the seed layer may be patterned, and an electroplating process may be performed to form the first lower redistribution wiring. The first lower redistribution wiring may include aluminum (Al), copper (Cu), tin (Sn), nickel (Ni), gold (Au), platinum (Pt), or an alloy thereof.

Although not illustrated in the figures, after bonding pads are formed on the first carrier substrate C1, the first lower redistribution wiring may be formed on the bonding pads. The bonding pads may be used to bond with conductive bumps, for example. In some examples, as described below, after a first semiconductor chip and a second redistribution wiring layer are formed on the first redistribution wiring layer 100, bonding pads such as UBM may be formed on redistribution pads of the first lower redistribution wiring.

The first lower insulation layer 100*a* may include a polymer, a dielectric layer, etc. The first lower insulation layer 100*a* may be formed by a vapor deposition process or a spin coating process, for example.

The first lower insulation layer 100*a* may be patterned to form openings that expose the first lower redistribution wiring 102*a*, and the second lower redistribution wiring 102*b* may be formed on the first lower insulation layer 100*a* to be electrically connected to the first lower redistribution wiring 102*a* through the openings respectively.

For example, after a seed layer is formed on a portion of the first lower insulation layer 100*a* and in the opening, the seed layer may be patterned, and an electroplating process may be performed to form the second lower redistribution wiring 102*b*. Accordingly, at least a portion of the second lower redistribution wiring 102*b* may directly contact with the first lower redistribution wiring 102*a* through the opening.

Similarly, after a second lower insulation layer 100*b* is formed on the first lower insulation layer 100*a*, which may cover the second lower redistribution wiring 102*b*. The second lower insulation layer 100*b* may be patterned to form openings that expose the second lower redistribution wiring 102*b* respectively. Subsequently, a third lower redistribution wiring 102*c* may be formed on the second lower insulation layer 100*b* to be electrically connected to the second lower redistribution wiring 102*b* through the openings respectively.

The third lower insulation layer 100*c* may be formed on the second lower insulation layer 100*b* and covers the third lower redistribution wiring 102*c*. The third lower insulation layer 100*c* may be patterned to form openings that expose the third lower redistribution wiring 102*c*. The third lower redistribution wiring 102*c* exposed by the openings may be an uppermost redistribution wiring. A portion of the uppermost redistribution wiring may include a redistribution pad portion. Although not illustrated in the figures, bump pad such as UBM may be formed on the redistribution pad portion.

Accordingly, the first redistribution wiring layer 100 having the first redistribution wiring 102 as a front redistribution wiring layer may be formed on the first carrier substrate C1. The first redistribution wiring layer 100 may include the first to third lower insulation layers 100*a*, 100*b* and 100*c* and the first redistribution wiring 102 in the stacked first to third lower insulation layers 100*a*, 100*b* and 100*c*. The first redistribution wiring 102 may include the first to third lower redistribution wiring 102*a*, 102*b* and 102*c*. For example, a thickness of the first redistribution wiring layer 100 may be within a range of about 5 μm to about 50 μm, and more particularly within a range of 5 μm to 50 μm.

The first redistribution wiring layer 100 may have a first surface 101*a* and a second surface 101*b* opposite each other. The first redistribution wiring layer 100 may include a first region R1 positioned in the central region and a second region R2 surrounding the first region R1. As will be described later, when viewed from a plan view, the first region R1 may be a chip mounting region overlapping the first semiconductor chip mounted on the second surface 101*b* of the first redistribution wiring layer 100, and the second region R2 may be a peripheral region in which a plurality of interposer connectors is disposed outside the first region R1.

The uppermost redistribution wiring 102*c* of the first redistribution wiring 102 may be include a first uppermost redistributions wiring 103*a*, disposed in the first region R1 and electrically connected to first chip pads of the first semiconductor chip, and the second uppermost redistribution wiring 103*b* disposed in the second region R2 and electrically connected to first connector pads of the interposer connector. Bump pads such as UBM may be formed on redistribution pad portions of the first uppermost redistribution wiring 103*a* and the second uppermost redistribution wiring 103*b*.

The number, size, arrangement, etc. of the lower insulation layers and the lower redistribution wiring of the first redistribution wiring layer are provided as examples, but the present disclosure may not be limited thereto.

Figure 5:
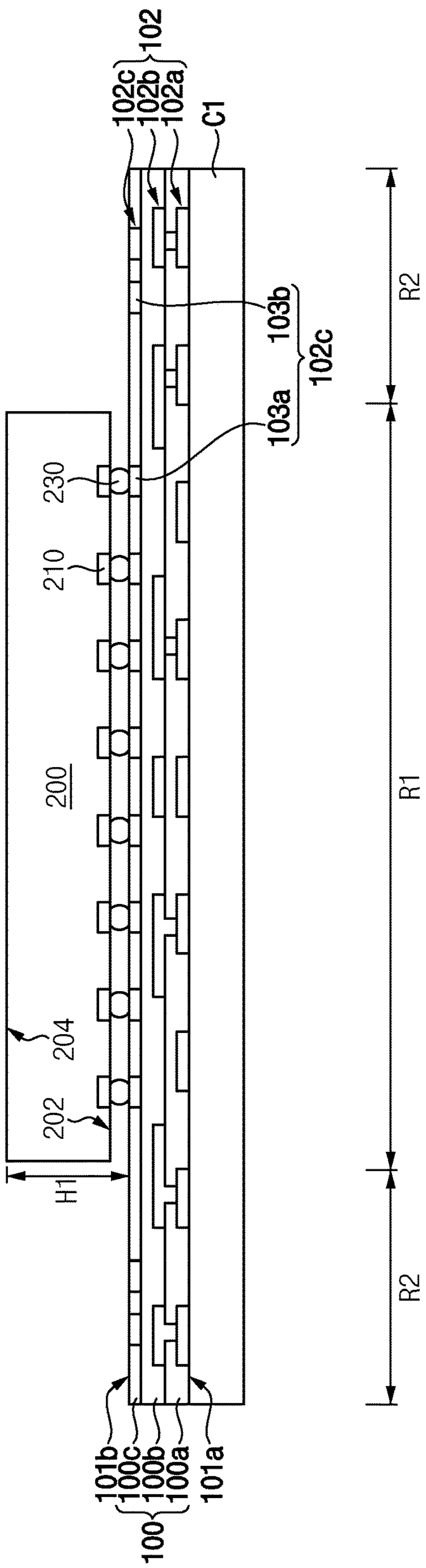

Referring to FIG. 5, a first semiconductor chip 200 may be mounted on the second surface 101*b* of the first redistribution wiring layer 100.

In example embodiments, the first semiconductor chip 200 may be disposed in the first region R1 of the first redistribution wiring layer 100. The first semiconductor chip 200 may be mounted on the second surface 101*b* of the first redistribution wiring layer 100 by a flip chip bonding method. The first semiconductor chip 200 may be disposed such that a front surface 202 on which first chip pads 210 are formed. That is, an active surface faces the first redistribution wiring layer 100. The first chip pads 210 of the first semiconductor chip 200 may be electrically connected to the first redistribution wiring 102 of the redistribution wiring layer 100, that is, the first uppermost redistribution wiring 103*a*, by first conductive bumps 230.

For example, the first conductive bumps 230 may include micro-bumps. A first conductive bump may include a pillar portion formed on the first chip pad and a solder portion formed on the pillar portion. The pillar portion may include, for example, copper (Cu), nickel (Ni), palladium (Pd), platinum (Pt), gold (Au), cobalt (Co), or an alloy thereof. The solder portion may include, for example, tin (Sn), indium (In), antimony (Sb), copper (Cu), silver (Ag), zinc (Zn), lead (Pb), or an alloy thereof.

Although not illustrated in the figures, a first underfill member may be underfilled between the first semiconductor chip 200 and the first redistribution wiring layer 100. The first underfill member may include a material having relatively high fluidity to effectively fill a small space between the first semiconductor chip and the first redistribution wiring layer. For example, the first underfill member may include an adhesive containing an epoxy material.

The first semiconductor chip 200 may have a first height H1 from the second surface 101*b* of the first redistribution wiring layer 100. For example, a thickness of the first semiconductor chip 200 may be within a range of about 100 μm to about 500 μm, and more particularly within a range of 100 μm to 500 μm.

The first semiconductor chip 200 may be a logic chip including a logic circuit. The logic chip may be a controller that controls memory chips. The first semiconductor chip 200 may be a processor chip such as an ASIC and an application processor (AP) serving as a host such as a CPU, GPU, or SOC. Various examples of the first semiconductor chip 200 are described herein, but the present disclosure may not be limited thereto.

Referring to FIGS. 6 to 13, a plurality of interposer connectors 300 may be formed, and the plurality of interposer connectors 300 may be disposed on the second surface 101*b* of the first redistribution wiring layer 100.

Figure 6:
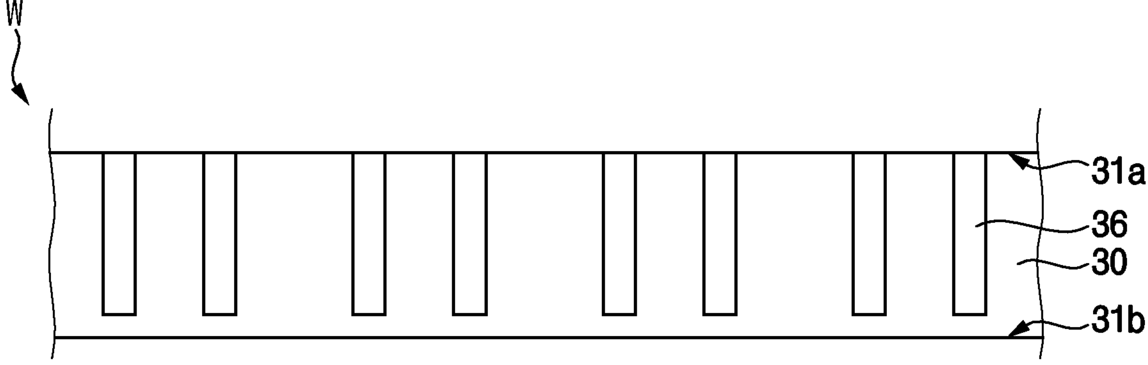

As illustrated in FIG. 6, through electrodes 36 may be formed in a substrate 30, such as a silicon wafer W, to partially extend through the substrate 30 from a first surface 31*a* of the substrate 30.

For example, a photoresist pattern may be formed on the first surface 31*a* to expose through electrode regions, and the substrate 30 may be etched using the photoresist pattern as an etching mask to form a plurality of trenches.

The trenches may be formed to have a predetermined depth from the first surface 31*a* of the substrate 30. The trenches may have a circular or rectangular cross-sectional shape, for example.

An insulation layer may be formed on the first surface 31*a* of the substrate 30 and an inner wall of the trench, a conductive layer may be formed to sufficiently fill the trench. The insulation layer may be formed to include, for example, an oxide such as silicon oxide or a nitride such as silicon nitride. The conductive layer may be formed by using, for example, a metal such as copper (Cu), aluminum (Al), tungsten (W), or doped polysilicon. In the case that the conductive layer is formed by using copper or aluminum, a seed layer may be formed on the insulation layer and an electroplating process may be performed to from the conductive layer. Additionally, a barrier layer may be sequentially formed on the insulation layer, and the barrier layer may be formed to include a metal nitride such as titanium nitride, tantalum nitride, tungsten nitride, copper nitride, or aluminum nitride.

The conductive layer and the insulation layer may be planarized to expose the first surface 31*a* of the substrate 30, to form the through electrodes 36 filling the trenches.

Figure 7:
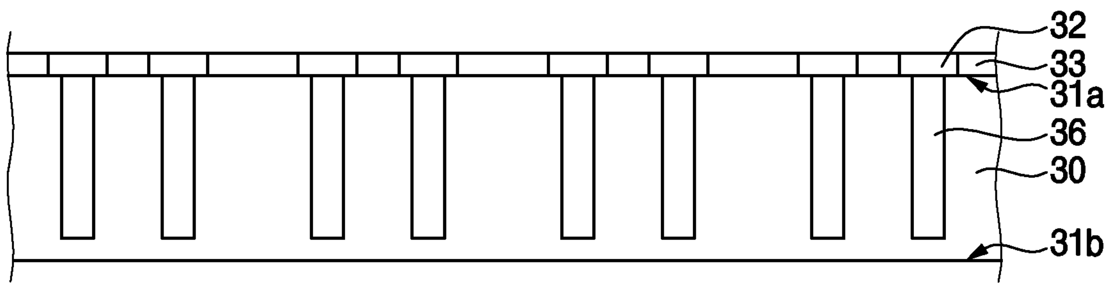

As illustrated in FIG. 7, first connector pads 32 may be formed on the first surface 31*a* of the substrate 30. The first connector pads 31 may be electrically connected to first end portions of the through electrodes 36. For example, a first insulation layer 33 may be formed on the first surface 31*a* of the substrate 30, the first insulation layer 33 may be patterned to form openings that expose the first end portions of the through electrodes 36 and the first connector pads 32 may be formed in the openings on the first end portions of the through electrodes 36.

Figure 8:
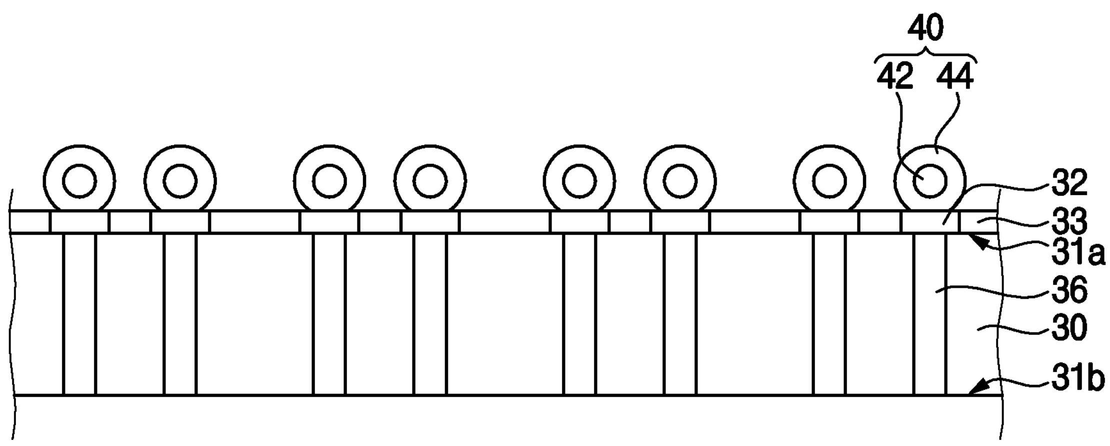

As illustrated in FIG. 8, core balls 40 may be formed on the first connector pads 32. The core ball 40 may include a core 42 and a solder layer 44 covering the core 42.

For example, the core 42 may have a spherical or ellipsoidal shape. The core 42 may include a different material from the solder layer 44. For example, the core 42 may include a metal such as copper (Cu) or polymer material. The solder layer 44 may include tin (Sn), indium (In), bismuth (Bi), antimony (Sb), copper (Cu), silver (Ag), zinc (Zn), lead (Pb), or an alloy thereof, for example.

A diameter of the core ball 40 may be within a range of about 30 μm to about 300 μm, and more particularly within a range of 30 μm to 300 μm. A diameter of the core 42 may be within a range of about 25 μm to about 250 μm, and more particularly within a range of 25 μm to 250 μm. In addition, the core 42 may have a first melting point, and the solder layer 44 may have a second melting point lower than the first melting point.

Figure 9:
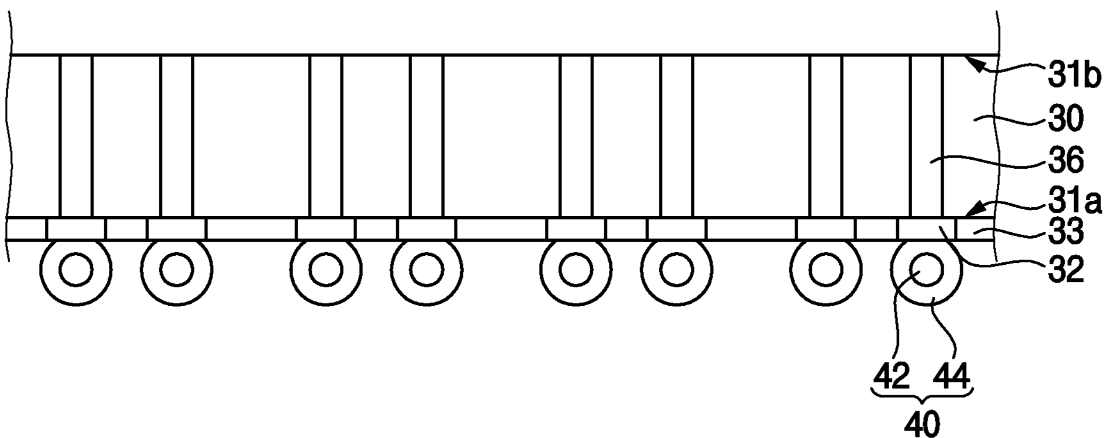

As illustrated in FIG. 9, the structure of FIG. 8 may be turned over and the second surface 31*b* of the substrate 30 may be partially removed to expose second end portions of the through electrodes 36. For example, the substrate 30 may be partially removed by an etch-back process, a polishing process, etc.

As illustrated in FIG. 10, second connector pads 34 may be formed on the second surface 31*b* of the substrate 30 to be electrically connected to the second end portions of the through electrodes 36. For example, after a second insulation layer 35 is formed on the second surface 31*b* of the substrate 30 and the second insulation layer 35 is patterned to form openings that expose the second end portions of the through electrodes 36, the second connector pads 34 may be formed in the openings on the second end portions of the through electrodes 36.

As illustrated in FIG. 11, the substrate 30 may be individually separated. The substrate 30 may be individually separated by, for example, a sawing process to form the plurality of interposer connectors 300.

The substrate 30 may be separated so that the interposer connectors 300 have a desired shape. For example, the interposer connector 300 may have a rectangular shape having a short side in a first direction and a long side in a second direction orthogonal to the first direction. Each of the interposer connectors 300 may include a connector substrate 310 in which a plurality of through electrodes 360 are formed, first connector pads 320 and second connector pads 340 respectively disposed on both end portions of the plurality of through electrodes 360, and core balls 400 formed on the first connector pads 320 and having a core 410 and a solder layer 420 surrounding the core 410.

In some examples, the interposer connector 300 may include the first surface 310*a* of the connector substrate 310, on which the first connector pads 320 are formed, and a second surface 310*b* of the connector substrate 310, on which the second connector pads 340 are formed.

The through electrodes 360 may be arranged in one direction in the connector substrate 310 to be spaced apart from each other. The interposer connector 300 may include a through electrode array arranged in a plurality of columns. The interposer connector 300 may include a plurality or rows and columns of through electrodes 360. For example, the interposer connector 300 may include two or more rows of through electrodes arranged in parallel to each other. In another example, the interposer connector 300 may include two or more columns of through electrodes arranged in parallel to each other.

As illustrated in FIGS. 12 and 13, the plurality of interposer connectors 300 may be mounted on the second region R2 of the first redistribution wiring layer 100 via the core balls 400.

In example embodiments, the plurality of interposer connectors 300 may be disposed in the second region R2 of the first redistribution wiring layer 100. The interposer connectors 300 may be mounted on the second surface 101*b* of the first redistribution wiring layer 100 by a flip chip bonding method. The interposer connector 300 may be disposed such that the first connector pads 320 on which the core balls 400 are formed face the first redistribution wiring layer 100. The core balls 400 may be bonded with bump pads on the first redistribution wiring 102 of the first redistribution wiring layer 100. That is, the core balls 400 may be bonded on the second uppermost redistribution wiring 103*b* of the third lower redistribution wiring 102*c*, by performing a thermal compression process or a reflow process. The first connector pads 320 of the interposer connector 300 may be electrically connected to the first redistribution wiring 102 of the first redistribution wiring layer 100, that is, the second uppermost redistribution wiring 103*b*, by the core balls 400.

As illustrated in FIG. 13, four interposer connectors 300 may be disposed around the first semiconductor chip 200 on the first redistribution wiring layer 100. When viewed from a plan view, the first semiconductor chip 200 may have a rectangular shape having four side portions E1, E2, E3, and E4. For example, the first semiconductor chip 200 may have a square shape. The four interposer connectors 300 may be disposed adjacent to the four side portions E1, E2, E3, and E4 of the first semiconductor chip 200, respectively.

The interposer connector 300 may have a short side L2 in the first direction (X direction) and a long side L1 in the second direction (Y direction). The long side L1 of the interposer connector 300 may be longer than a length of the side portion E2 of the first semiconductor chip 200. Alternatively, the long side L1 of the interposer connector 300 may be shorter than the length of the side portion E2 of the first semiconductor chip 200.

The first semiconductor chip 200 has the first height H1 from the second surface 101*b* of the first redistribution wiring layer 100. The interposer connector 300 may have a second height H2 from the second surface 101*b* of the first redistribution wiring layer 100. The second height H2 may be greater than or equal to the first height H1.

The interposer connectors 300 may be mounted on the first redistribution wiring layer 100 via the core balls 400 having the core 410 and the solder layer 420. The interposer connector 300 may be maintained to have a constant height on the first redistribution wiring layer 100 by the core balls 400. In addition, non-wetting defects due to warpage may be prevented as the core balls 400 support the interposer connector 300 when forming the molding member and the second redistribution wiring layer.

The lengths of the short and long sides of the interposer connector, the height of the interposer connector, the arrangement of the through electrodes, etc. are provided as examples, and the present disclosure may not be limited thereto. The lengths of the short and long sides of the interposer connector, the height of the interposer connector, and the arrangement of the through electrodes, etc. may be determined in consideration of the thickness, warpage of the entire package, etc.

Figure 14:
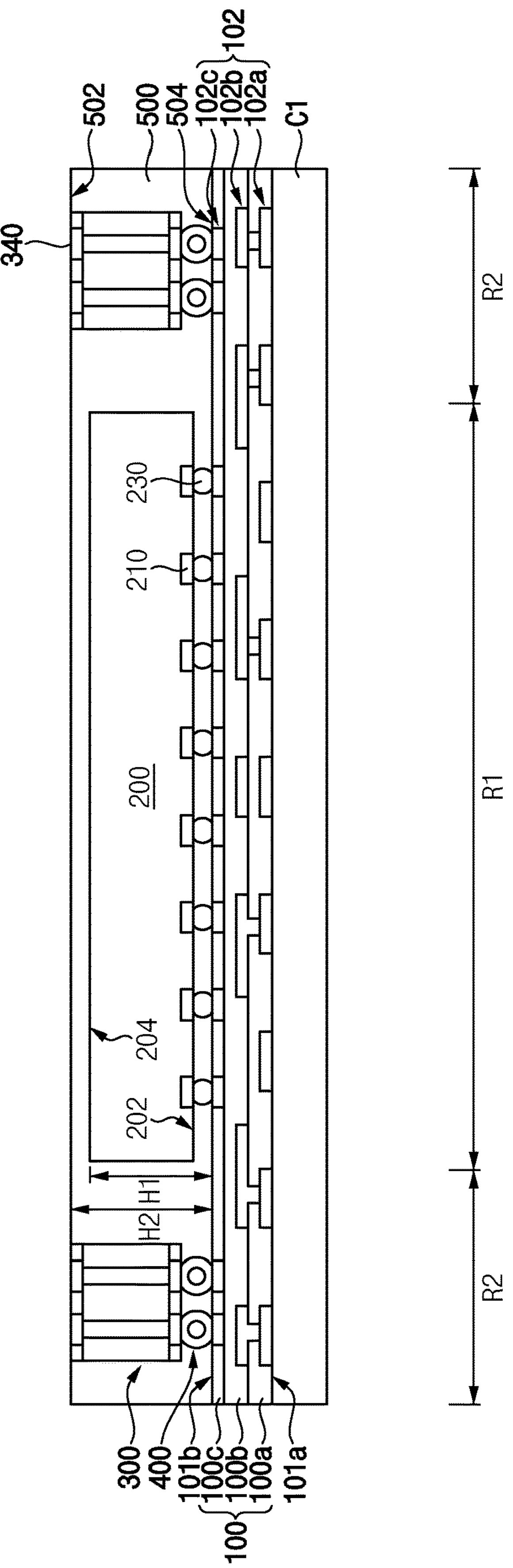

Referring to FIG. 14, the molding member 500 may be formed on the second surface 101*b* of the first redistribution wiring layer 100, and may cover the first semiconductor chip 200 and the plurality of interposer connectors 300.

For example, the molding member 500 may include an epoxy mold compound. The molding member 500 may include a UV resin, a polyurethane resin, a silicon resin, a silica filler, etc.

In example embodiments, after a molding material is formed on the second surface 101*b* of the first redistribution wiring layer 100 covering upper surfaces of the first semiconductor chip 200 and the plurality of interposer connectors 300, an upper portion of the molding material may be partially removed to expose the second connector pads 340 of the interposer connectors 300.

Accordingly, the second connector pads 340 of the plurality of interposer connectors 300 may be exposed by an upper surface 502 of the molding member 500.

Figure 15:
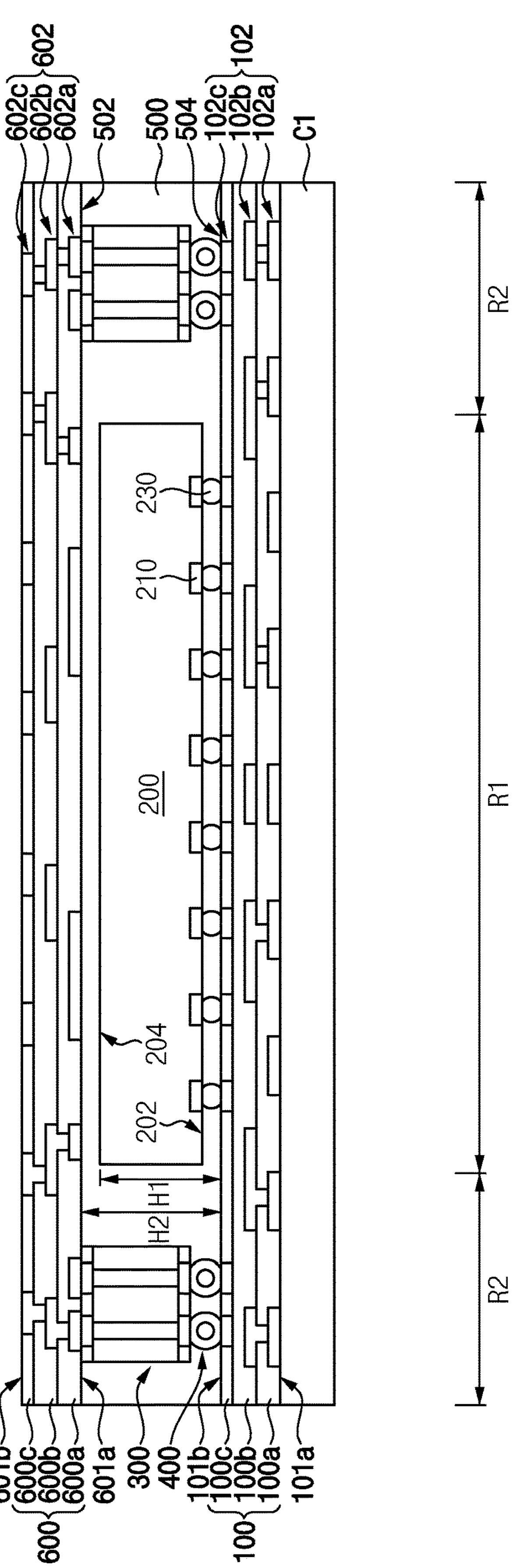

Referring to FIG. 15, the second redistribution wiring layer 600 having the second redistribution wiring 602 may be formed on the upper surface 502 of the molding member 500. The second redistribution wiring 602 may be electrically connected to the second connector pads 340.

In example embodiments, the first upper redistribution wiring 602*a* may be formed on at least portions of the second connector pads 340 exposed from the molding member 500, and the first upper insulation layer 600*a* may be formed on the molding member 500, which may cover the first upper redistribution wiring 602*a*.

For example, the first upper redistribution wiring 602*a* may be formed by an electrolytic plating process. A seed layer is formed on the molding member 500, the seed layer may be patterned and an electroplating process may be performed to form the first upper redistribution wiring 602*a*. The first upper and lower redistribution wiring may include, for example, aluminum (Al), copper (Cu), tin (Sn), nickel (Ni), gold (Au), platinum (Pt), or an alloy thereof.

The first upper insulation layer 600*a* may include a polymer or a dielectric layer. The first upper insulation layer 600*a* may be formed by a vapor deposition process, a spin coating process, etc.

The first upper insulation layer 600*a* may be patterned to form openings exposing the first upper redistribution wiring 602*a*, and the second upper redistribution wiring 602*b* may be formed to be electrically connected to the first upper redistribution wiring 602*a* through the openings on the first upper insulation layer 600*a* respectively.

For example, the seed layer may be formed on a portion of the first upper insulation layer 600*a* and in the opening, the seed layer may be patterned and an electroplating process may be performed to form the second upper redistribution wiring 602*b*. Accordingly, at least a portion of the second upper redistribution wiring 602*b* may directly contact the first upper redistribution wiring 602*a* through the opening.

Similarly, the second upper insulation layer 600*b* may be formed, which may cover the second upper redistribution wiring 602*b* on the first upper insulation layer 600*a*. The second upper insulation layer 600*b* may be patterned to form openings exposing the second upper redistribution wiring 602*b* respectively. The third upper redistribution wiring 602*c* may be formed on the second upper insulation layer 600*b* to be electrically connected to the second upper redistribution wiring 602*b* through the openings respectively.

A third upper insulation layer 600*c* may be formed, which may cover the third upper redistribution wiring 602*c* on the second upper insulation layer 600*b*. The third upper insulation layer 600*c* may be patterned to form openings exposing the third upper redistribution wiring 602*c* respectively. The third upper redistribution wiring 602*c* exposed by the openings may be an outermost redistribution wiring. A portion of the outermost redistribution wiring may include a redistribution pad portion. Although not illustrated in the figures, a bump pad such as UBM may be formed on the redistribution pad portion.

Accordingly, the second redistribution wiring layer 600 may be formed on the molding member 500 to have the second redistribution wiring 602 as a backside redistribution wiring layer. The second redistribution wiring layer 600 may include the first upper insulation layer 600*a*, the second upper insulation layer 600*b* and the third upper insulation layer 600*c*, and the second redistribution wiring 602 in the stacked first to third upper insulation layers 600*a*, 600*b* and 600*c*. The second redistribution wiring 602 may include the first upper redistribution wiring 602*a*, the second upper redistribution wiring 602*b*, and the third upper redistribution wiring 602*c*. The second redistribution wiring layer 600 may have a first surface 601*a* and a second surface 601*b* opposite each other.

The number, size, arrangement, etc. of the upper insulation layers and the upper redistribution wiring of the second redistribution wiring layer are provided as examples, and the present disclosure may not be limited thereto.

The external connection members 130 (see FIG. 1) may be formed on the first surface 101*a* of the first redistribution wiring layer 100. The external connection members, such as solder balls, may be respectively formed on bonding pads on redistribution pad portions of the first lower redistribution wiring 102*a* of the first redistribution wiring layer 100.

The semiconductor package 10 (see FIG. 1) may be completed as an individual fan-out package by cutting the first redistribution wiring layer 100 and the second redistribution wiring layer 600.

Figure 16:
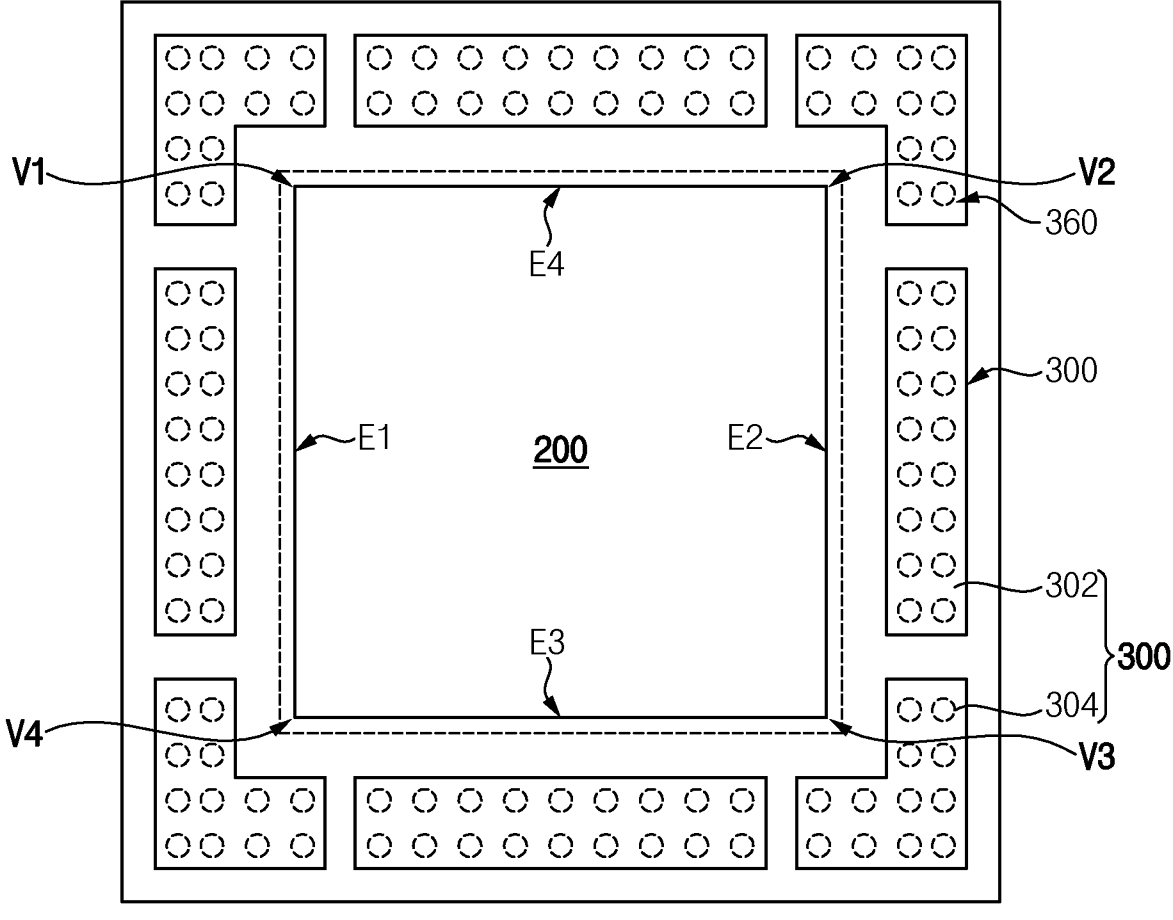
FIG. 16 is a plan view illustrating an arrangement of interposer connectors in accordance with example embodiments.
Figure 16:
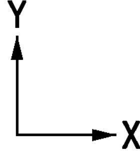

FIG. 16 is a plan view illustrating an arrangement of interposer connectors in accordance with example embodiments.

Referring to FIG. 16, each the interposer connectors 300 may include a first connector 302 extending along the side portion E2 of the first semiconductor chip 200 and a second connector 304 extending along a corner portion V3 of the first semiconductor chip 200.

For example, the four first connectors 302 may extend respectively along the side portions E1, E2, E3 and E4 of the first semiconductor chip 200, and the four second connectors 304 may extend respectively along the corner portions V1, V2, V3 and V4 of the first semiconductor chip 200.

The first connector 302 extending along the second side portion E2 of the first semiconductor chip 200 may have a short side in the first direction (X direction) and a long side in the second direction (Y direction). The long side of the first connector 302 may have a length less than the length of the second side portion E2 of the first semiconductor chip 200.

The second connectors 304 may extend along the corner portions V1, V2, V3 and V4 of the first semiconductor chip 200. The second connectors 304 may prevent warpage at the corner region of a semiconductor package.

Figure 17:
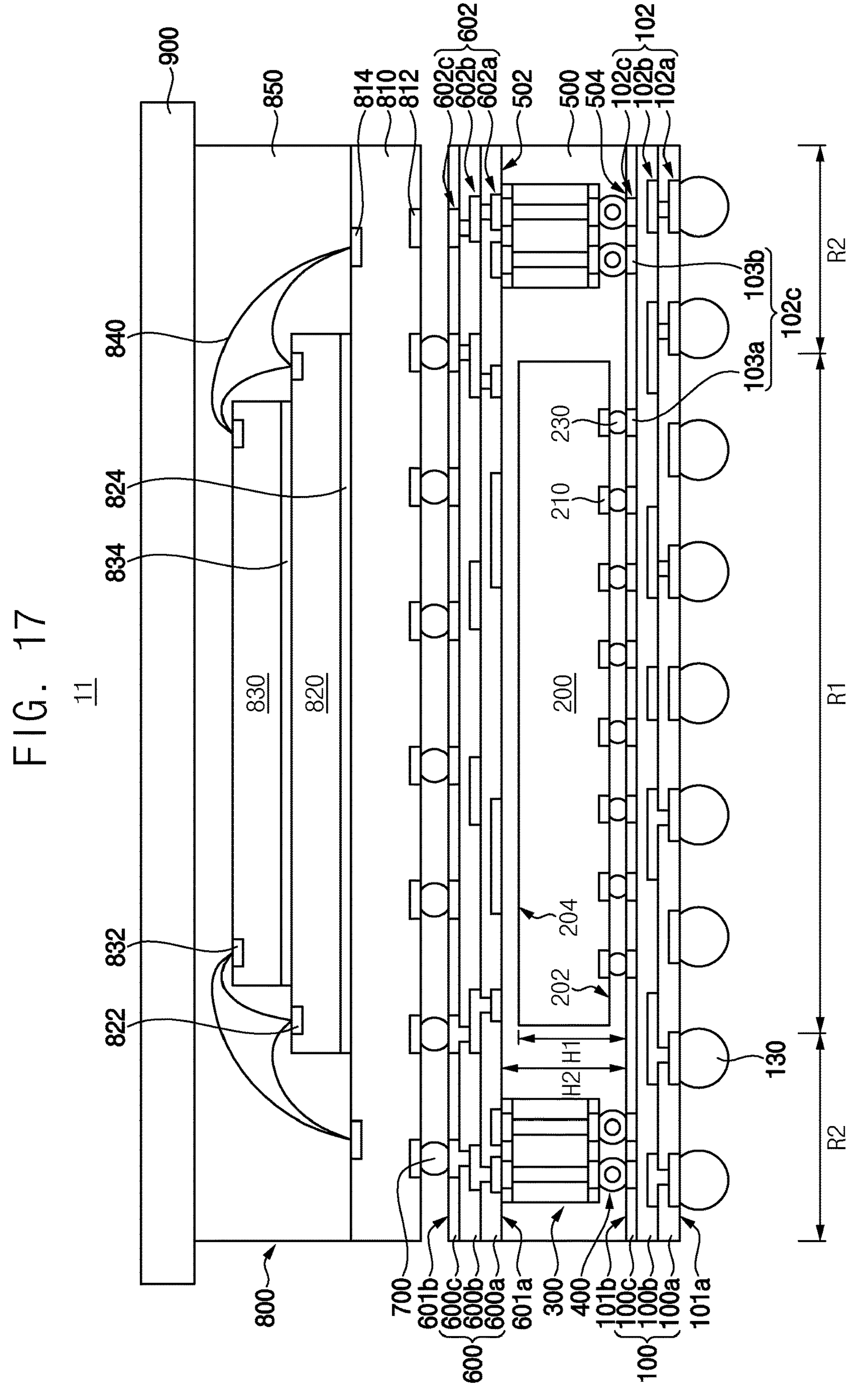
FIG. 17 is a cross-sectional view illustrating a semiconductor package in accordance with example embodiments.

FIG. 17 is a cross-sectional view illustrating a stacked semiconductor package 11 in accordance with example embodiments. The stacked semiconductor package 11 may be include a first package, which may be substantially the same as the semiconductor package 10 described with reference to FIG. 1, and a second package 800. The same reference numerals denote the same components, and repeated description of the same components may be omitted. In example embodiments, the second package 800 may be stacked on the first package via conductive connection members 700. The first package may be, for example, the semiconductor package 10, and may include the first redistribution wiring layer 100, the first semiconductor chip 200, the plurality of interposer connectors 300, the molding member 500 and the second redistribution wiring layer 600.

The second package 800 may include a second package substrate 810, a second semiconductor chip 820 and a third semiconductor chip 830. The second semiconductor chip 820 and the third semiconductor chip 830 may be mounted on the second package substrate 810. The second package 800 may include a molding member 850 covering the second and third semiconductor chips 820 and 830 on the second package substrate 810.

The second package 800 may be stacked on the first package via the conductive connection members 700. For example, the conductive connection members 700 may include solder balls, conductive bumps, etc.

The conductive connection member 700 may be arranged between a bump pad on the third upper redistribution wiring 602*c* of the second redistribution wiring layer 600 and a first substrate pad 812 of the second package substrate 810. Thus, the first package and the second package 800 may be electrically connected each other by the conductive connection members 700.

The second semiconductor chip 820 and the third semiconductor chip 830 may be stacked on the second package substrate 810 by a first adhesive member 824 and a second adhesive member 834. Bonding wires 840 may connect first chip pads 822 and second chip pads 832 of the second and third semiconductor chips 820 and 830 to second substrate pads 814 of the second package substrate 810. The second and third semiconductor chips 820 and 830 may be electrically connected to the second package substrate 610 through the bonding wires 840.

Although the second package 800 may include two semiconductor chips mounted by a wire bonding method, it may be understood that the number of semiconductor chips in the second package and a mounting method may not be limited thereto.

The second semiconductor chip 820 may include a memory chip including a memory circuit. For example, the second semiconductor chip 820 may include a volatile memory device such as an SRAM device or a DRAM device and a nonvolatile memory device such as a flash memory device, a PRAM device, an MRAM device, or an RRAM device.

The above-described stacked semiconductor package 11 may include a semiconductor device such as a logic device or a memory device. The stacked semiconductor package 11 may include a logic device such as a central processing unit (CPU, MPU), an application processor (AP), a volatile memory device such as an SRAM device or a DRAM device and a nonvolatile memory device such as a flash memory device, a PRAM device, an MRAM device, or an RRAM device.

In example embodiments, a heat sink 900 may be disposed on the second package 800. The heat sink may dissipate heat from the first and second packages to the outside. The heat sink 900 may be attached on the second package 800 by using a thermal interface material (TIM), for example.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of the present disclosure and is not to be construed as limited to exemplary embodiments disclosed, and that modifications to disclosed exemplary embodiments, as well as other exemplary embodiments, are intended to be included within the scope of the appended claims. The present disclosure is defined by the following claims, with equivalents of the claims to be included therein.

What is claimed is:

1. A semiconductor package, comprising:

a first redistribution wiring layer including a first redistribution wiring;

a semiconductor chip disposed on the first redistribution wiring layer;

a plurality of interposer connectors disposed on the first redistribution wiring layer, each of the plurality of interposer connectors including a first surface facing the first redistribution wiring layer and a second surface opposite the first surface, a plurality of through electrodes and a plurality of core balls formed on the first surface, each of the core balls including a core and a solder layer covering the core, the through electrodes being electrically connected to the first redistribution wiring by the core balls;

a molding member disposed on the first redistribution wiring layer that covers the semiconductor chip; and a second redistribution wiring layer disposed on the molding member, the second redistribution wiring layer including a second redistribution wiring electrically connected to the through electrodes.

2. The semiconductor package of claim 1, further comprising:

first connector pads disposed on first end portions of the plurality of through electrodes and on which the core balls are bonded; and second connector pads disposed on second end portions of the plurality of through electrode.

3. The semiconductor package of claim 2, wherein the second connector pads are electrically connected to the second redistribution wiring.

4. The semiconductor package of claim 1, wherein the semiconductor chip is electrically connected to the first redistribution wiring layer via a plurality of conductive bumps disposed on a plurality of chip pads of the semiconductor chip facing the first redistribution wiring layer.

5. The semiconductor package of claim 1, wherein the semiconductor chip has a first height from the first redistribution wiring layer, the interposer connector has a second height from the first redistribution wiring layer, and the second height is greater than or equal to the first height.

6. The semiconductor package of claim 1, wherein when viewed from a plan view, the interposer connectors have a rectangular shape having a short side in a first direction and a long side in a second direction orthogonal to the first direction.

7. The semiconductor package of claim 1, wherein the interposer connectors further comprise a connector substrate including a silicon material, wherein the plurality of through electrodes penetrate the connector substrate.

8. The semiconductor package of claim 1, wherein the through electrode has a diameter of about 100 μm to about 300 μm.

9. The semiconductor package of claim 1, further comprising:

a second package disposed on the second redistribution wiring layer, the second package electrically connected to the second redistribution wiring, the second package including at least one second semiconductor chip mounted therein.

10. The semiconductor package of claim 1, further comprising:

external connection members disposed on an outer surface of the first redistribution layer, the external connection members electrically connected to the first redistribution wiring.

11. A semiconductor package, comprising:

a first redistribution wiring layer including a chip mounting region and a peripheral region surrounding the chip mounting region, the first redistribution wiring layer having a first redistribution wiring;

a semiconductor chip mounted on the chip mounting region on the first redistribution wiring layer;

a plurality of interposer connectors disposed on the peripheral region of the first redistribution wiring layer, each of the plurality of interposer connectors including a connector substrate in which a plurality of through electrodes are formed, first connector pads at first end portions of the plurality of through electrodes, second connector pads at second end portions of the plurality of through electrodes opposite the first end portions and a plurality of core balls on the first connector pads, each of the core balls having a core and a solder layer surrounding the core, the plurality of interposer connectors electrically connected to the first redistribution wiring layer via the core balls;

a molding member disposed on the first redistribution wiring layer that covers the semiconductor chip; and a second redistribution wiring layer disposed on the molding member and having a second redistribution wiring electrically connected to the second connector pads.

12. The semiconductor package of claim 11, wherein the semiconductor chip is electrically connected to the first redistribution wiring layer via a plurality of conductive bumps.

13. The semiconductor package of claim 11, wherein the semiconductor chip has a first height from the first redistribution wiring layer, the interposer connector has a second height from the first redistribution wiring layer, and the second height is greater than or equal to the first height.

14. The semiconductor package of claim 11, wherein when viewed from a plan view, the connector substrate has a rectangular shape having a short side in a first direction and a long side in a second direction orthogonal to the first direction.

15. The semiconductor package of claim 11, wherein the connector substrate includes a silicon material.

16. The semiconductor package of claim 11, further comprising:

a second package disposed on the second redistribution wiring layer, the second package electrically connected to the second redistribution wiring layer, the second package including at least one second semiconductor chip mounted therein.

17. The semiconductor package of claim 11, further comprising:

external connection members disposed on an outer surface of the first redistribution wiring layer and electrically connected to the first redistribution wiring.

18. A method of manufacturing a semiconductor package, the method comprising:

forming a first redistribution wiring layer including a chip mounting region and a peripheral region surrounding the chip mounting region and having a first redistribution wiring;

mounting a semiconductor chip on the chip mounting region on the first redistribution wiring layer;

forming a plurality of interposer connectors, each of the plurality of interposer connectors including a connector substrate in which a plurality of through electrodes are formed, first connector pads at first end portions of the plurality of through electrodes, second connector pads at second end portions of the plurality of through electrodes opposite the first end portions and a plurality of core balls on the first connector pads, each of the core balls having a core and a solder layer surrounding the core;

mounting the plurality of interposer connectors in the peripheral region on the first redistribution wiring layer via the core balls;

forming a molding member on the first redistribution wiring layer covering the semiconductor chip; and forming a second redistribution wiring layer on the molding member, the second redistribution wiring layer including a second redistribution wiring electrically connected to the second connector pads.

19. The method of claim 18, wherein forming the plurality of interposer connectors comprises:

forming the plurality of through electrodes partially extending through a silicon substrate;

forming the first connector pads electrically connected to the first end portions of the through electrodes;

forming the second connector pads electrically connected to the second end portions of the through electrodes;

forming the core balls on the first connector pads; and sawing the silicon substrate to form the interposer connectors.

20. The method of claim 19, wherein mounting the plurality of interposer connectors via the core balls on the peripheral region on the first redistribution wiring layer comprises:

arranging the core balls on the first redistribution wiring layer; and bonding the core balls to the first redistribution wiring of the first redistribution wiring layer.

* * * * *